United States Patent
Taniguchi et al.

(10) Patent No.: US 11,892,514 B2
(45) Date of Patent: *Feb. 6, 2024

(54) BATTERY MONITORING SYSTEM

(71) Applicant: DENSO CORPORATION, Kariya (JP)

(72) Inventors: Soya Taniguchi, Kariya (JP);
Yoshikazu Furuta, Kariya (JP);
Takeshi Kondo, Kariya (JP); Kazutaka Honda, Kariya (JP)

(73) Assignee: DENSO CORPORATION, Kariya (JP)

( * ) Notice: Subject to any disclaimer, the term of this patent is extended or adjusted under 35 U.S.C. 154(b) by 121 days.

This patent is subject to a terminal disclaimer.

(21) Appl. No.: 17/462,133

(22) Filed: Aug. 31, 2021

(65) Prior Publication Data

US 2022/0074999 A1   Mar. 10, 2022

(30) Foreign Application Priority Data

Sep. 4, 2020 (JP) .................................. 2020-149047

(51) Int. Cl.
*G01R 31/3842* (2019.01)
*G01R 31/389* (2019.01)
*G01R 31/396* (2019.01)

(52) U.S. Cl.
CPC ....... *G01R 31/3842* (2019.01); *G01R 31/389* (2019.01); *G01R 31/396* (2019.01)

(58) Field of Classification Search
CPC . G01R 31/3842; G01R 31/389; G01R 31/396
See application file for complete search history.

(56) References Cited

U.S. PATENT DOCUMENTS

| | | | |
|---|---|---|---|
| 2012/0112785 A1* | 5/2012 | Mizoguchi | G01R 35/00 324/762.08 |
| 2017/0254854 A1* | 9/2017 | Honda | H02J 7/0068 |
| 2021/0184474 A1* | 6/2021 | Kobayashi | H02J 7/0014 |
| 2021/0223327 A1* | 7/2021 | Berger | G01R 31/396 |
| 2022/0190622 A1* | 6/2022 | Kobayashi | H02J 7/007182 |

FOREIGN PATENT DOCUMENTS

| | | |
|---|---|---|
| WO | 2020003841 A | 1/2020 |
| WO | 2020045418 A | 3/2020 |

OTHER PUBLICATIONS

Si et al., "Design and implementation of current source based on battery AC impedance method" IEEE 2017 (Year: 2017).*

* cited by examiner

*Primary Examiner* — John C Kuan
(74) *Attorney, Agent, or Firm* — POSZ LAW GROUP, PLC

(57) ABSTRACT

An assembled battery monitoring device in the present disclosure includes: an excitation signal processor generates a excitation signal by processing an in-phase signal of an orthogonal reference signal generated by a signal generator; a current exciter generates an excitation current based on the excitation signal according to voltage signals, and energizes a battery cell; and an impedance measurer measures an AC impedance of the battery cell based on the excitation current measured by the current measurer and a voltage of the battery cell measured by the voltage measurer.

7 Claims, 13 Drawing Sheets

BATTERY MONITORING SYSTEM

CROSS REFERENCE TO RELATED APPLICATION

The present application is based on and claims the benefit of priority of Japanese Patent Application No. 2020-149047, filed on Sep. 4, 2020, the disclosure of which is incorporated herein by reference.

TECHNICAL FIELD

The present disclosure generally relates to a system for monitoring a plurality of battery cells constituting an assembled battery.

BACKGROUND INFORMATION

In recent years, electric vehicles and the like using secondary batteries have become worldly widespread, and the demand for battery management systems (BMS) for the safely use of the secondary batteries is increasing. By measuring the AC impedance and the like of the secondary battery, it is possible to estimate the internal state including the remaining battery level (State of Charge: SOC).

SUMMARY

It is an object of the present disclosure to provide a battery monitoring system capable of measuring an impedance of a secondary battery by suppressing an increase in a circuit area size.

BRIEF DESCRIPTION OF THE DRAWINGS

Objects, features, and advantages of the present disclosure will become more apparent from the following detailed description made with reference to the accompanying drawings, in which.

DETAILED DESCRIPTION

First Embodiment

Figure 1:
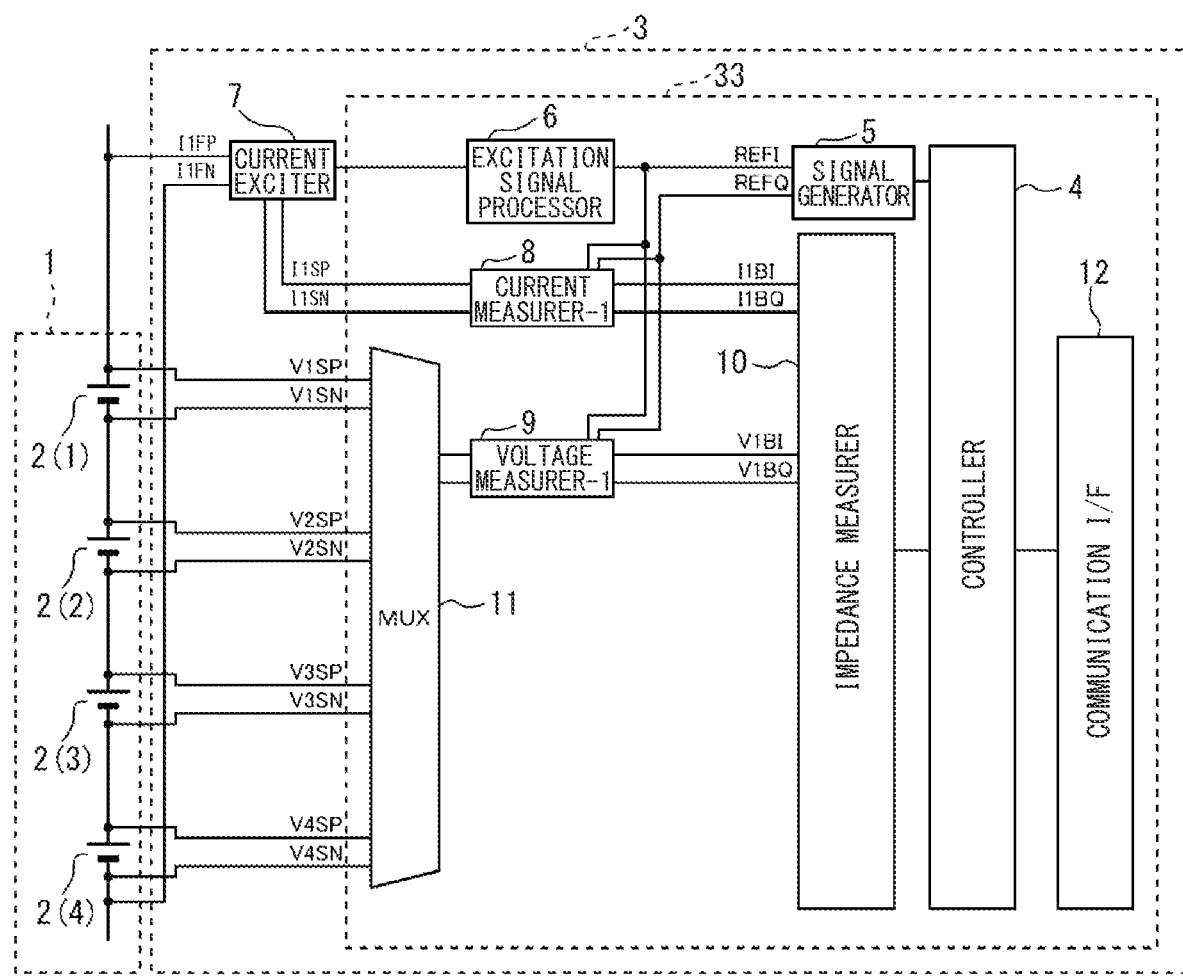
FIG. 1 is a functional block diagram of a configuration of a battery monitoring device according to a first embodiment.

As shown in FIG. 1, an assembled battery 1 is configured by connecting a plurality of, for example, four battery cells 2 (1) to 2 (4) in series. The battery cell 2 is a secondary battery such as a lithium ion battery. An assembled battery monitoring device 3 connected to the assembled battery 1 includes a controller 4, a signal generator 5, an excitation signal processor 6, a current exciter 7, a current measurer 8, a voltage measurer 9, an impedance measurer 10, a multiplexer 11 and a communication I/F 12 and the like. The current exciter 7, the current measurer 8, and the voltage measurer 9 are provided corresponding to each battery cell 2. The communication I/F 12 is used for the assembled battery monitoring device 3 to communicate with a higher-level system described later.

Figure 7:
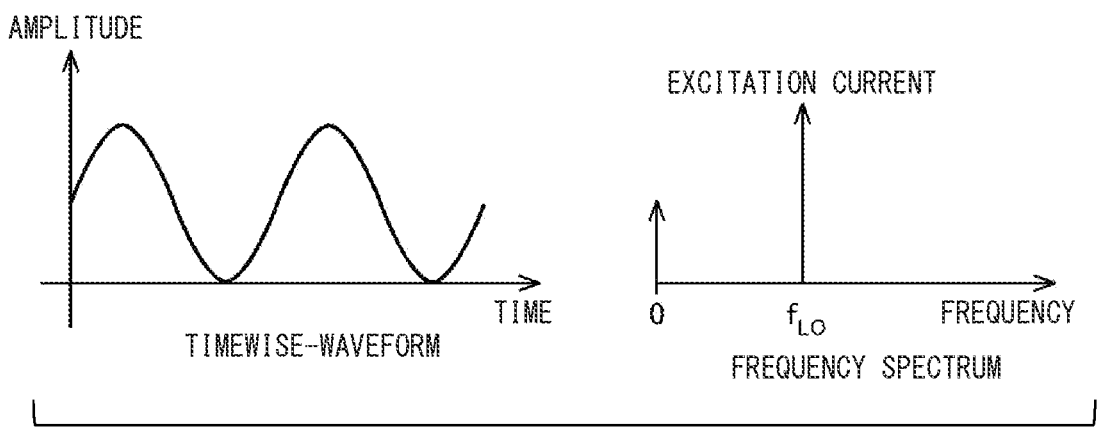
FIG. 7 is a diagram of an excitation current waveform and a frequency spectrum.

The current measurers 8 (1) to 8 (4) are connected to an upper electrode and a lower electrode of each of the battery cells 2 (1) to 2 (4), respectively. As shown in FIG. 7, the signal generator 5 generates orthogonal reference signals REF_I and REF_Q which are sine waves and cosine waves having the same frequency as the measurement frequency fLO. These orthogonal reference signals REFI and REF_Q are output to the current measurer 8 and the voltage measurer 9. Only the reference signal REFI is input to the excitation signal processor 6.

Figure 2:
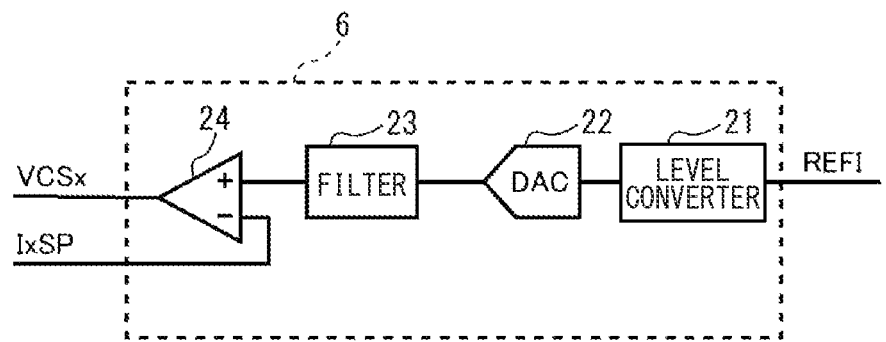
FIG. 2 is a diagram of a configuration of an excitation signal processor.

As shown in FIG. 2, the excitation signal processor 6 level-converts the input reference signal REF_I according to a target excitation current set by the controller 4 by using the level converter 21, that is, imparts a DC offset, and converts digital signal to an analog voltage signal by using an digital-analog converter (DAC) 22. The analog voltage signal is input to an error amplifier 24 after an image component added by a demodulation process is removed by a filter 23.

A voltage signal IxSP from the current exciter 7 is input to an inverting input terminal of the error amplifier 24, and an output signal VCSx is controlled to match a potential difference of IxSP from the voltage signal IxSN with the voltage signal given to a non-inverting input terminal as a control target value. Note that x=1 to 4 in the above. As shown in FIG. 7, the excitation current output from the current exciter 7 is an alternating current to which a DC offset is applied, and its frequency component includes a direct current component and a measurement frequency fLO.

Figure 3:
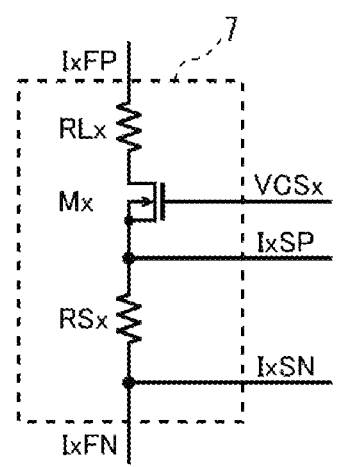
FIG. 3 is a diagram of a configuration of a current exciter.

As shown in FIG. 3, the current exciter 7 is composed of a series circuit of a resister element RLx, an N-channel MOSFET_Mx, and a resister element RSx. The output signal VCSx of the excitation signal processor 6 is given to the gate of MOSFET_Mx, and both ends of the resister element RSx are input to the excitation signal processor 6 and the current measurer 8 as voltage signals IxSP and IxSN, respectively. Then, both ends of the series circuit described above are output as excitation current signals IxFP and IxFN. That is, the current exciter 7 generates the excitation current signals IxFP and IxFN so that a terminal voltage of the element RSx, which is a sense resistor, matches the control target value.

Figure 4:
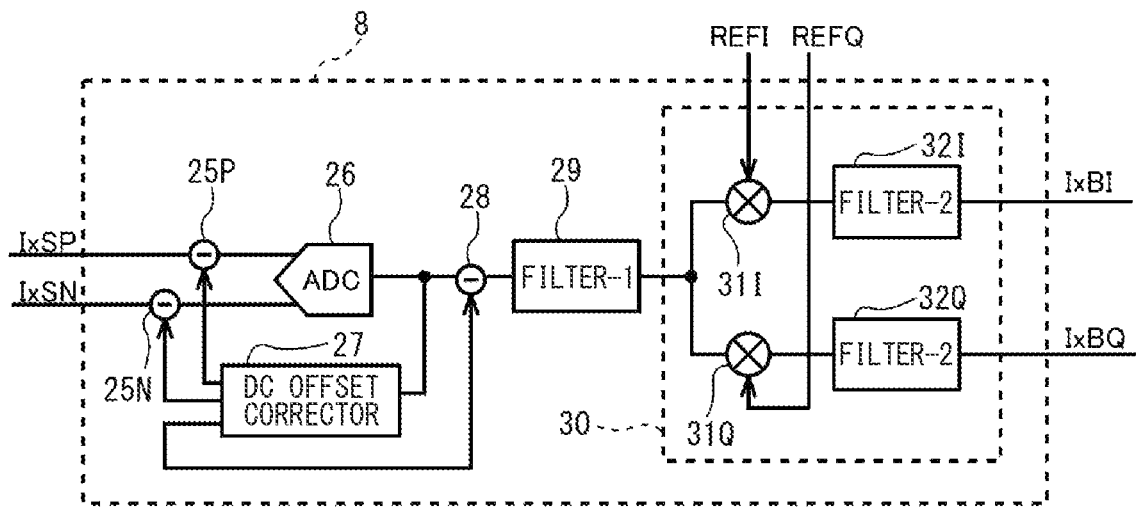
FIG. 4 is a diagram of a configuration of a current measurer.

As shown in FIG. 4, the current measurer 8 includes a subtractor 25P and 25N, an analog-digital converter (ADC) 26, a DC offset corrector 27, a subtractor 28, a filter 29, and an orthogonal demodulator 30. The voltage signals IxSP and IxSN are input to the ADC 26 via the subtractors 25P and 25N, respectively. The voltage data converted by the ADC 26 is input to the DC offset corrector 27 and to the subtractor 28. The DC offset corrector 27 generates a DC offset correction value according to the output data of the ADC 26, and inputs it to the subtractors 25 and 28.

The output data of the subtractor 28 is input to the orthogonal demodulator 30 via the filter 29. The orthogonal demodulator 30 is composed of multipliers 31I and 31Q and filters 32I and 32Q. The output data of the filter 29 is input to the multipliers 31I and 31Q. Reference signals REF_I and REF_Q are also input to the multipliers 31I and 31Q, respectively, and each input signal is multiplied to perform orthogonal demodulation. Image components of the output data of the multipliers 31I and 31Q are removed therefrom vy the filters 32I and 32Q, respectively, and data IxBI and IxBQ are generated, and these data are input to the impedance measurer 10.

Figure 5:
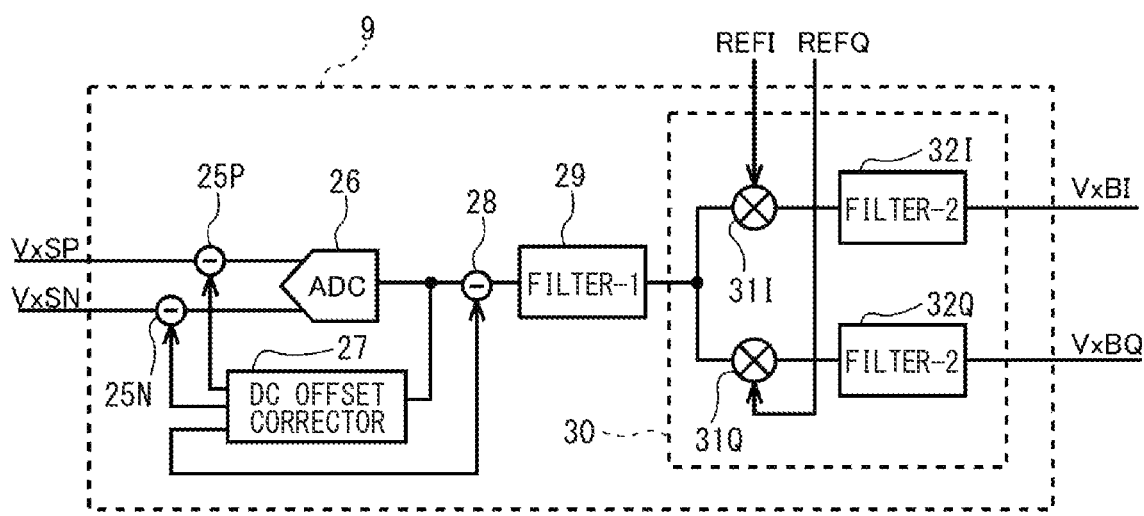
FIG. 5 is a diagram of a configuration of a voltage measurer.
Figure 6:
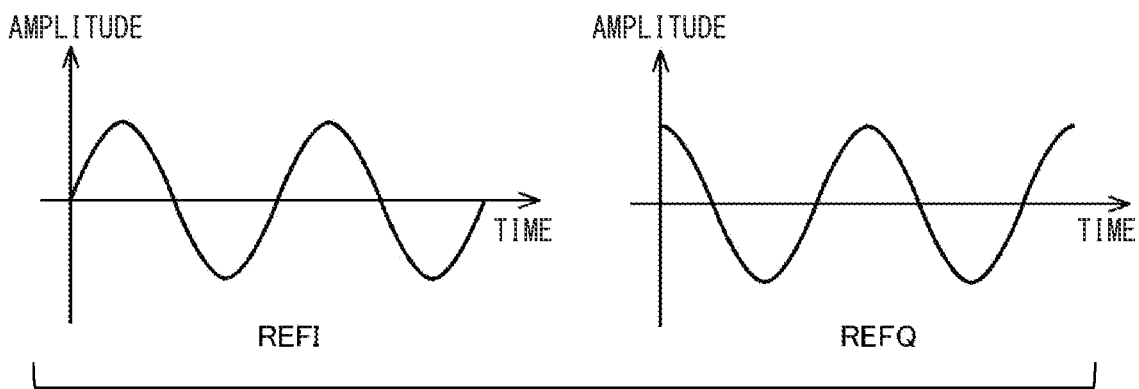
FIG. 6 is a diagram of a waveform of an orthogonal reference signal.

Note that the configuration of the voltage measurer 9 is symmetrical with that of the current measurer 8 as shown in FIG. 5, and the corresponding components are designated by the same reference numerals. Terminal voltages VxSP and VxSN of each battery cell 2 are input to the voltage measurer 9 via the multiplexer 11, and orthogonal demodulation is performed in the same manner as the current measurer 8 to generate data VxBI and VxBQ, and such data is input to the impedance measurer 10. The switching control of the multiplexer 11 is performed by the controller 4. Further, in the battery monitoring device 3, a portion other than the current exciter 7 is configured as an integrated circuit 33.

Figure 8:
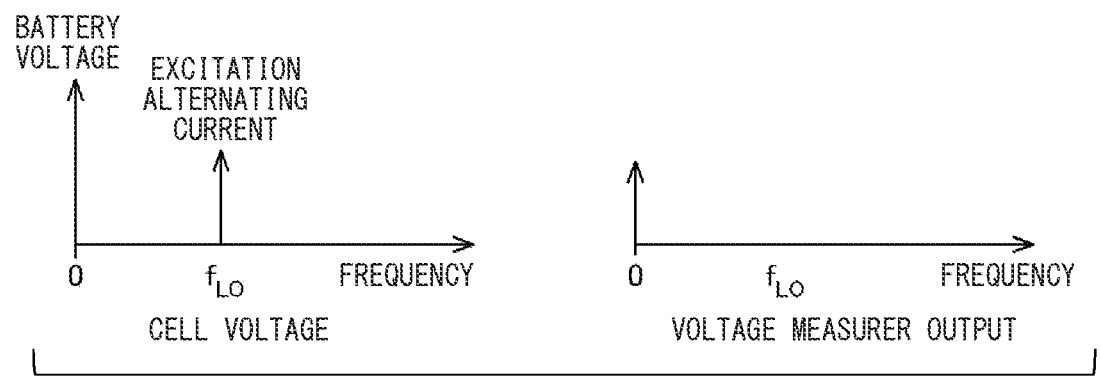
FIG. 8 is a diagram of a frequency spectrum of an excitation AC voltage in an ideal state and a frequency spectrum of a voltage output from the voltage measurer.

When the excitation current is applied to the battery cell 2, it is converted to a voltage by AC impedance. The ideal frequency spectra of the excitation voltages VxSP and VxSN generated at both ends of the battery cell 2 generate signals in the DC component and the measurement frequency fLO, as shown in FIG. 8. The DC component is the sum of the product of the voltage, impedance, and DC offset of the excitation current of the battery cell 2, and an AC voltage, which is the product of the AC impedance and the excitation AC current, is generated at the frequency fLO. At such time, the voltage output as the measurement result of the voltage measurer 9 is only the DC voltage of the battery cell 2.

Figure 9:
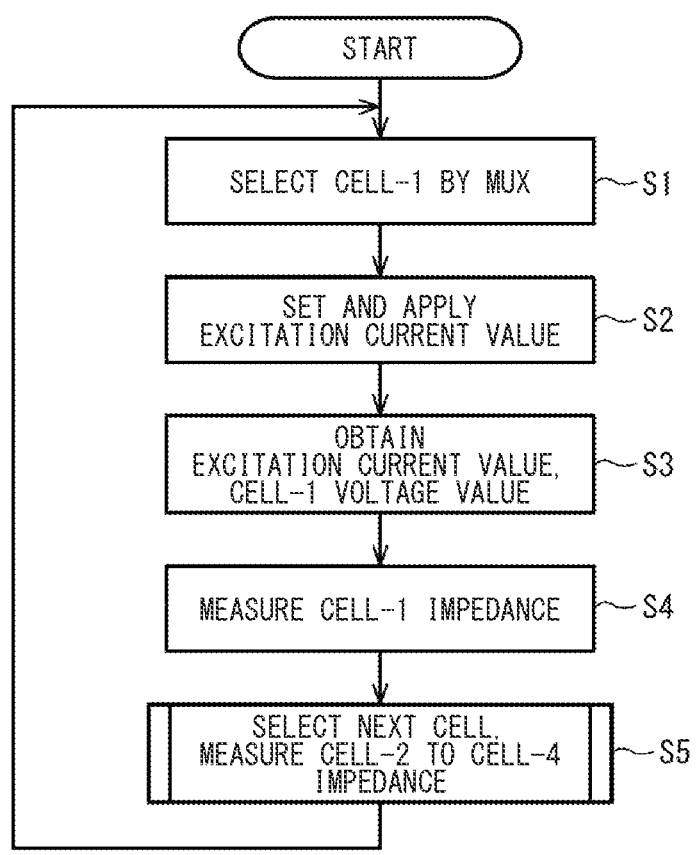
FIG. 9 is a flowchart of a measurement process by the battery monitoring device.

An operation of the present embodiment is described in the following. As shown in FIG. 9, when the battery cell 2 (1) is selected by the multiplexer 11 (S1), the controller 4 sets an excitation current value in the excitation signal processor 6 by the reference signal REF_I, and applies the excitation current to the battery cell 2 (S2). Note that battery cell 2 (1) is shown in the drawing as CELL-1.

Then, the impedance measurer 10 obtains excitation current data I1BI and I1BQ via the current measurer 8 and obtains voltage data V1BI and V1BQ via the voltage measurer 9 (S3), and measures impedance of the battery cell 2 (1) (S4). Note that battery cell 2 (1) is shown in the drawing as CELL-1.

In the same manner thereafter, the controller 4 sequentially selects the battery cells 2 (2) to 2 (4) by the multiplexer 11, and the impedance measurer 10 measures the impedance of the battery cells 2 (2) to 2 (4), respectively (S5). When the impedance of the battery cell 2 (4) is measured, the process proceeds to step S1.

Figure 10:
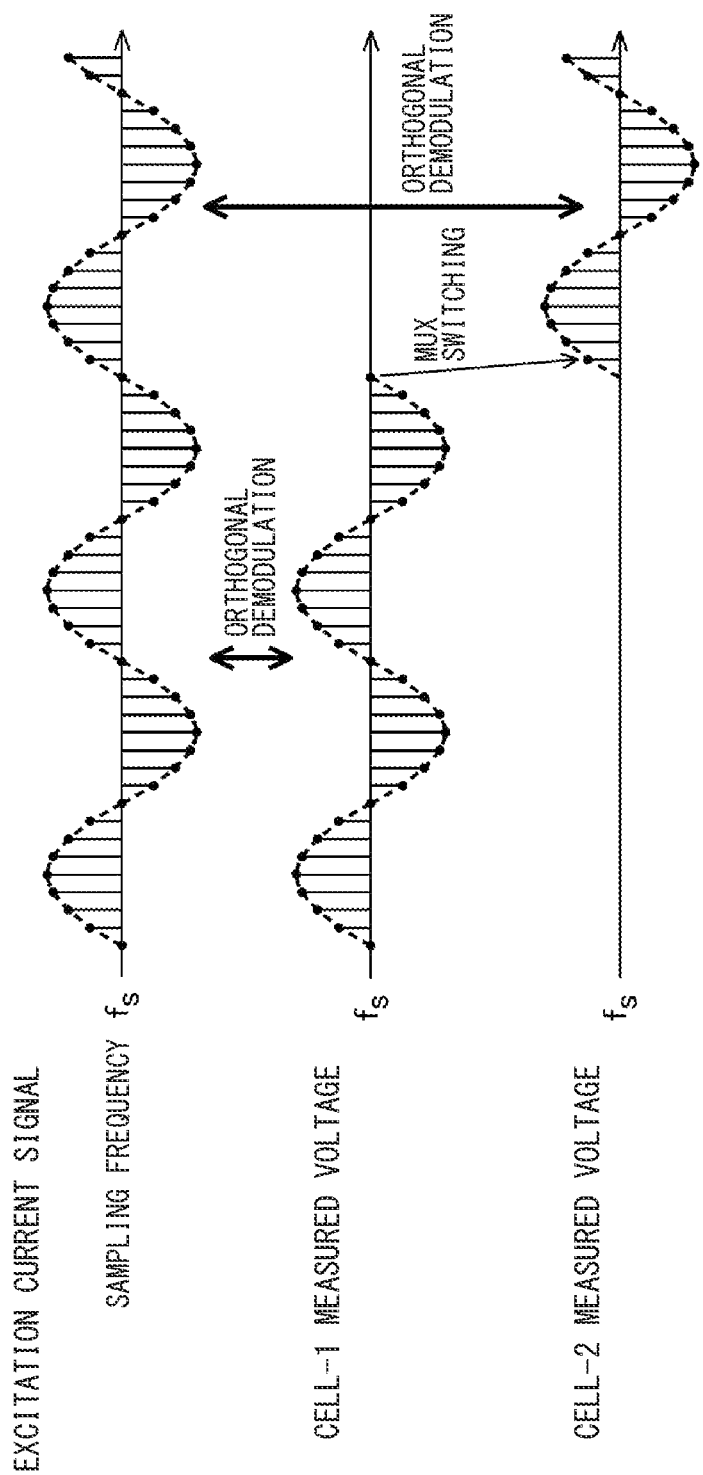
FIG. 10 is a diagram of sampling data of excitation current and voltage.

In the present embodiment, as shown in FIG. 10, the sampling frequency of the excitation current in the current measurer 8 and the sampling frequency of the excitation current in the voltage measurer 9 are the same, i.e., frequency fs.

As described above, according to the assembled battery monitoring device 3 of the present embodiment, the excitation signal processor 6 generates the excitation signal VCSx by processing the in-phase signal REF_I of the orthogonal reference signal generated by the signal generator 5, and the current exciter 7 generates an excitation current based on the excitation signal VCSx according to the voltage signals IxSP and IxSN, and energizes the battery cell 2. The impedance measurer 10 measures the AC impedance of the battery cell 2 based on the excitation current measured by the current measurer 8 and the voltage of the battery cell 2 measured by the voltage measurer 9.

At such time, the controller 4 selects one battery cell 2 by the multiplexer 11 that switches the connection between the battery cells 2 (1) to 2 (4) and the voltage measurer 9, and allows the impedance measurer 10 to measure the AC impedance thereof. With such configuration, the number of voltage measurers 9 for measuring the voltage of each of the battery cells 2 (1) to 2 (4) can be reduced to reduce the circuit area size. Therefore, even when the number of battery cells 2 to be measured increases, the battery monitoring system can be made compact (i.e., made to have a small volume/dimension) and the cost of the monitoring system can be reduced.

Further, when the AC impedance of one battery cell 2 is measured, the controller 4 switches the multiplexer 11 to a different battery cell 2, thereby enabling impedance measurement of each of the battery cells 2 sequentially, i.e., in order, with the measurement rates of the voltage and current matched to each other to the above-described sampling frequency. Thus, when determining the remaining amount of charge of each battery cell 2, the impedance measurement is performable in a stable state.

Second Embodiment

Figure 11:
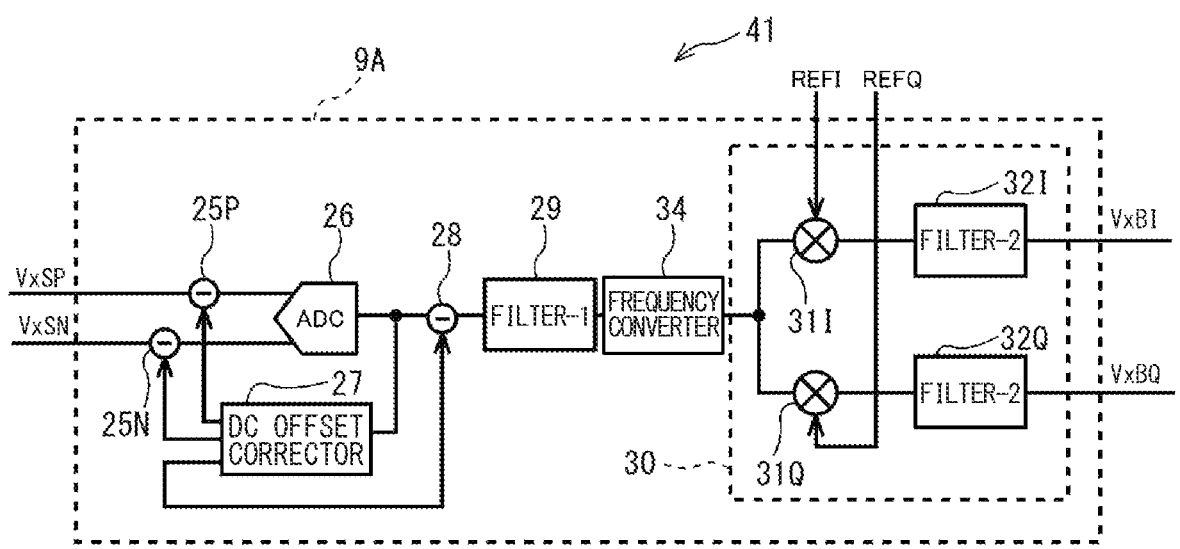
FIG. 11 is a diagram of a configuration of the current measurer according to a second embodiment.
Figure 13:
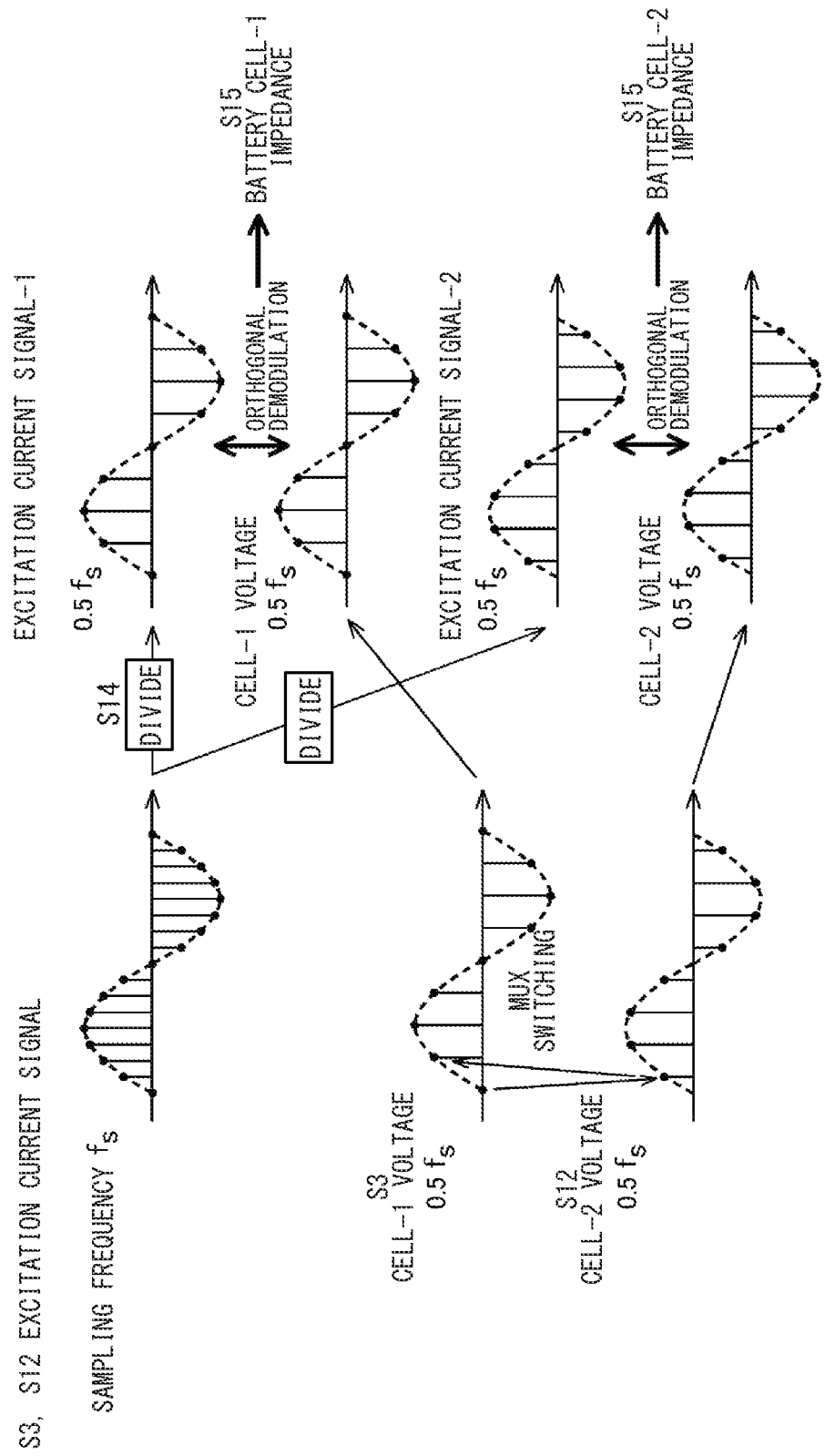
FIG. 13 is a diagram of data processing corresponding to the flowchart of FIG. 12.

Hereinafter, the same parts as those in the first embodiment are set with the same reference numerals, the description thereof is omitted, and different parts therefrom are described. As shown in FIG. 11, in a battery monitoring device 41 of the second embodiment, a voltage measurer 9A includes a frequency converter 34 at a position between the filter 29 and the orthogonal demodulator 30. The sampling frequency in the voltage measurer 9A is converted to 0.5 fs by the frequency converter 34 as shown in FIG. 13.

Figure 12:
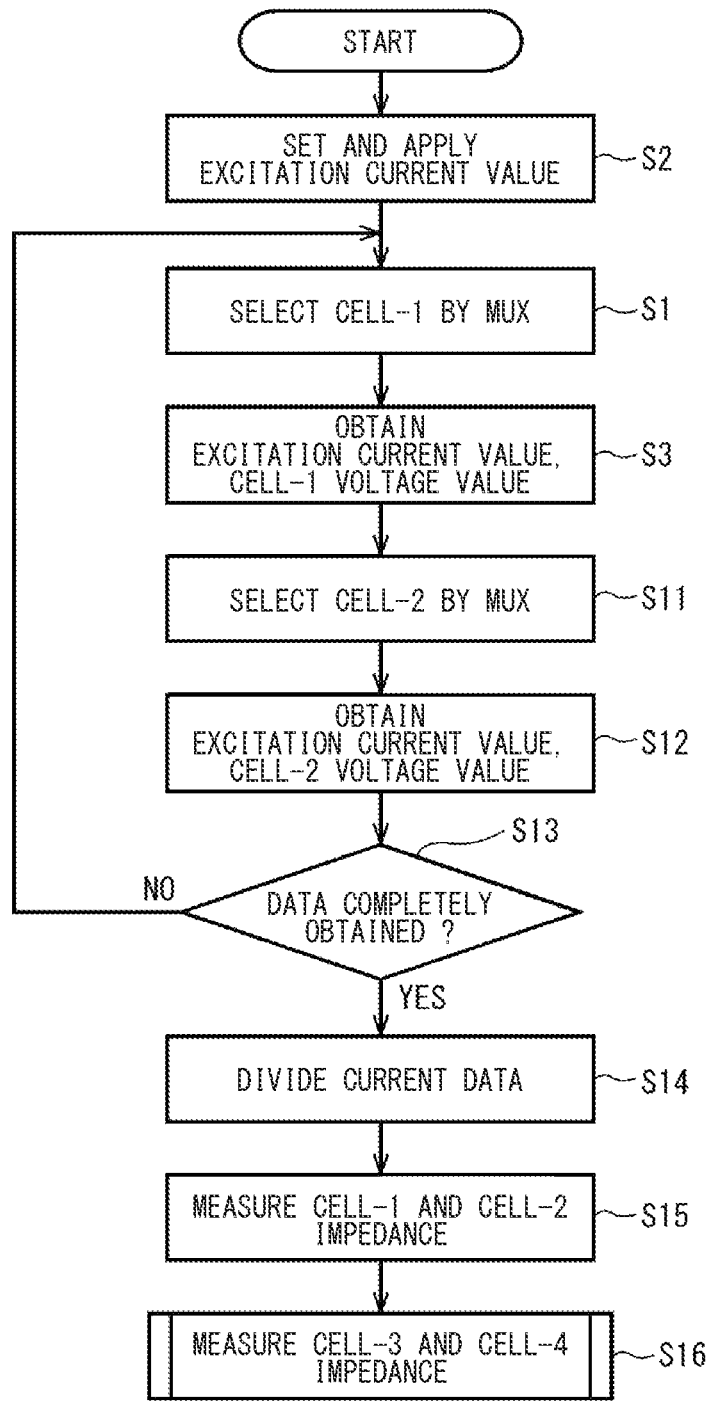
FIG. 12 is a flowchart of a measurement process by the battery monitoring device.

Operation of the second embodiment is described in the following. As shown in FIG. 12, when the controller 4 has performed the processing in an order of steps S2, S1 and S3, the battery cell 2 (2) is selected by the multiplexer 11 (S11), and the impedance measurer 10 obtains the excitation current data I2BI and I2BQ by the current measurer 8, and obtains the voltage data V2BI and V2BQ by the voltage measurer 9A (S12).

Figure 15:
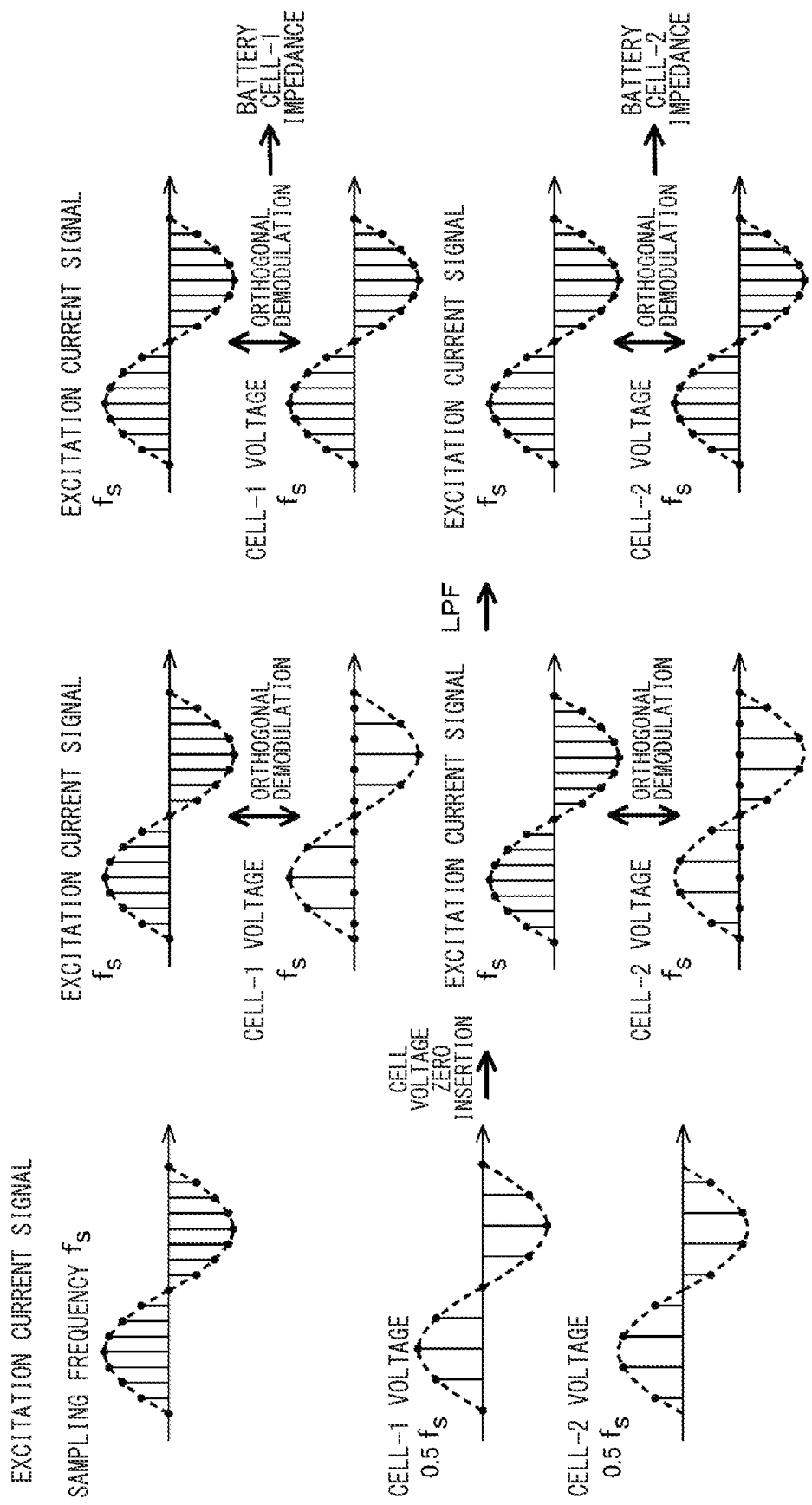
FIG. 15 is a diagram of data processing of the voltage measurer.

Then, for the battery cells 2 (1) and 2 (2), it is determined whether or not the data has completely been obtained for one AC cycle of the electric current and the voltage (S13), and if the data has not been completely obtained (S13: NO), the process returns to step S1. In such case, the voltage data of the battery cells 2 (1) and 2 (2) are alternately obtained at every 0.5 fs frequency, as shown in FIG. 15.

When the data is completely obtained (S13: YES), the impedance measurer 10 divides the obtained data at the frequency fs into two for the battery cells 2 (1) and 2 (2) (S14). Then, the impedance of the battery cells 2 (1) and 2 (2) is measured (S15). In the same manner thereafter, the controller 4 alternately selects the battery cells 2 (3) and 2 (4) by the multiplexer 11, and the impedance measurer 10 measures the impedance of the battery cells 2 (3) and 2 (4) (S16).

As described above, according to the second embodiment, the controller 4 switches the multiplexer 11 for each sampling cycle. In such manner, the impedance measurement of the battery cells 2 (1) and 2 (2) and the impedance measurement of the battery cells 2 (3) and 2 (4) can be performed in parallel, respectively, so that the immediacy of each measured value can be improved.

Third Embodiment

Figure 14:
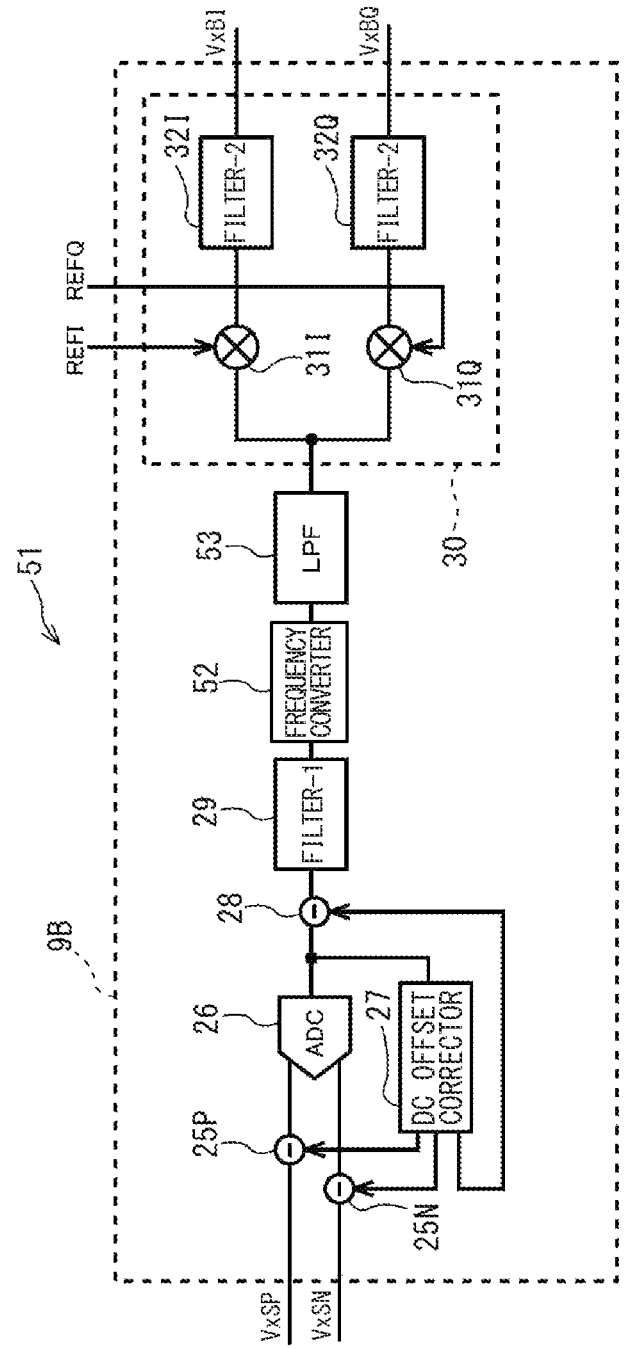
FIG. 14 is a diagram of a configuration of the voltage measurer according to a third embodiment.

The third embodiment is a modification of the second embodiment. As shown in FIG. 14, a current measurer 51 is shown. A voltage measurer 9B of the third embodiment includes a low pass filter (LPF) 53 at a position between the multiplier 31 and a frequency converter 52 that replaces the frequency converter 34. As shown in FIG. 15, the frequency converter 52, which is an example of a rate adjuster, adjusts the sampling frequency of the voltage to the sampling frequency of the electric current, by inserting zeroes to in-between positions of the voltage data obtained at every 0.5 fs frequency. Then, the LPF 53 is applied to a data group into which the zero data is inserted to interpolate the data.

As described above, according to the third embodiment, the frequency converter 52 adjusts the sampling rate of the electric current by the current measurer 8 and the sampling rate of the voltage by the voltage measurer 9B to match with each other. More specifically, zero data is inserted between the voltage data obtained at every 0.5 fs frequency, and the LPF 53 is applied to interpolate the data. In such manner, the setting of the cutoff frequency in the filter 32 that is provided in the output unit of the voltage measurer 9B.

Fourth Embodiment

Figure 16:
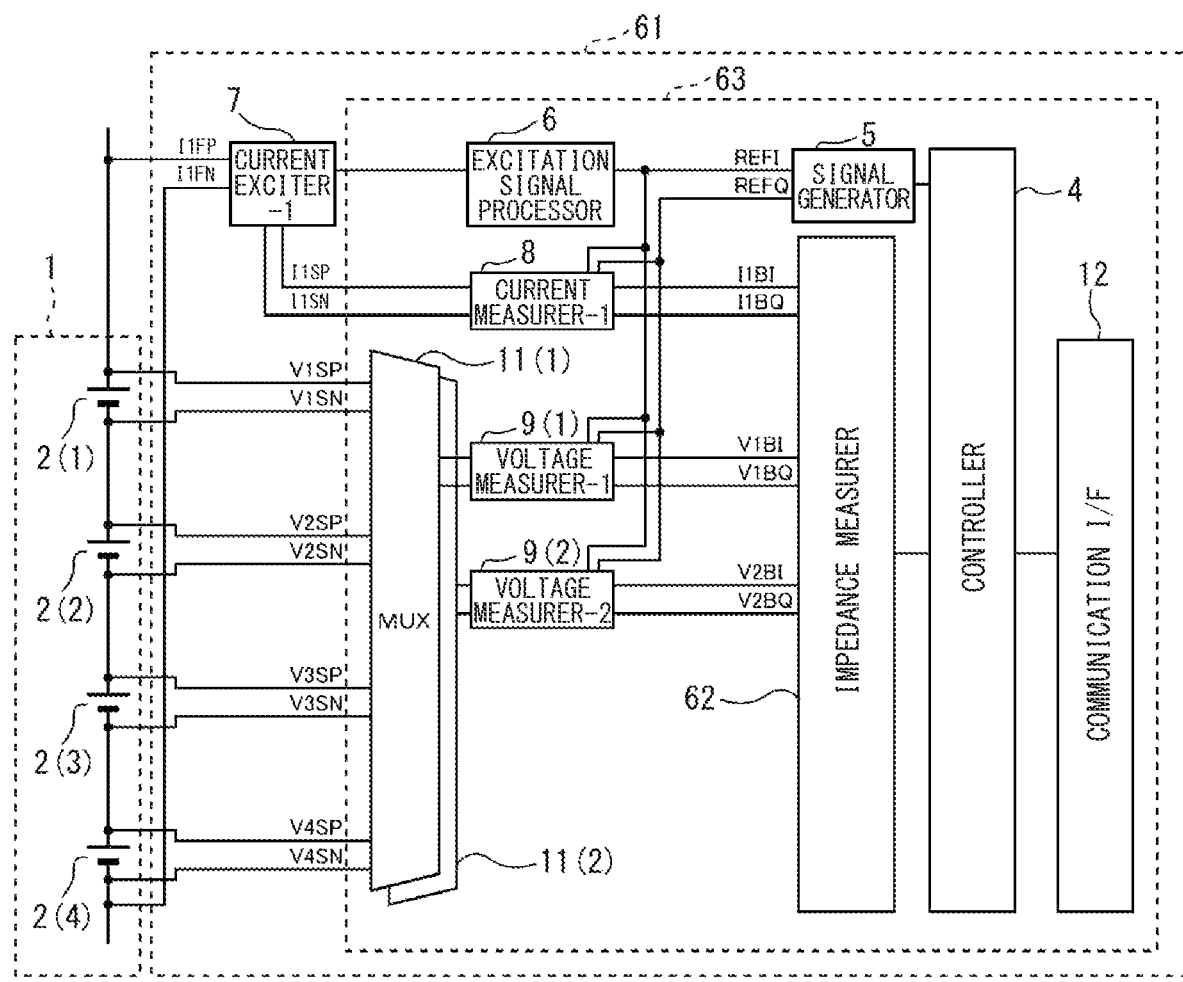
FIG. 16 is a functional block diagram of a configuration of the battery monitoring device according to a fourth embodiment.

As shown in FIG. 16, a battery monitoring device 61 of the fourth embodiment includes two multiplexers 11 and two voltage measurers 9, respectively, and an impedance measurer 62 is enabled to perform voltage measurement and impedance measurement of the two battery cells 2 in parallel. Further, in the battery monitoring device 61, a portion other than the current excitation portion 7 is configured as an integrated circuit 63.

Fifth Embodiment

Figure 17:
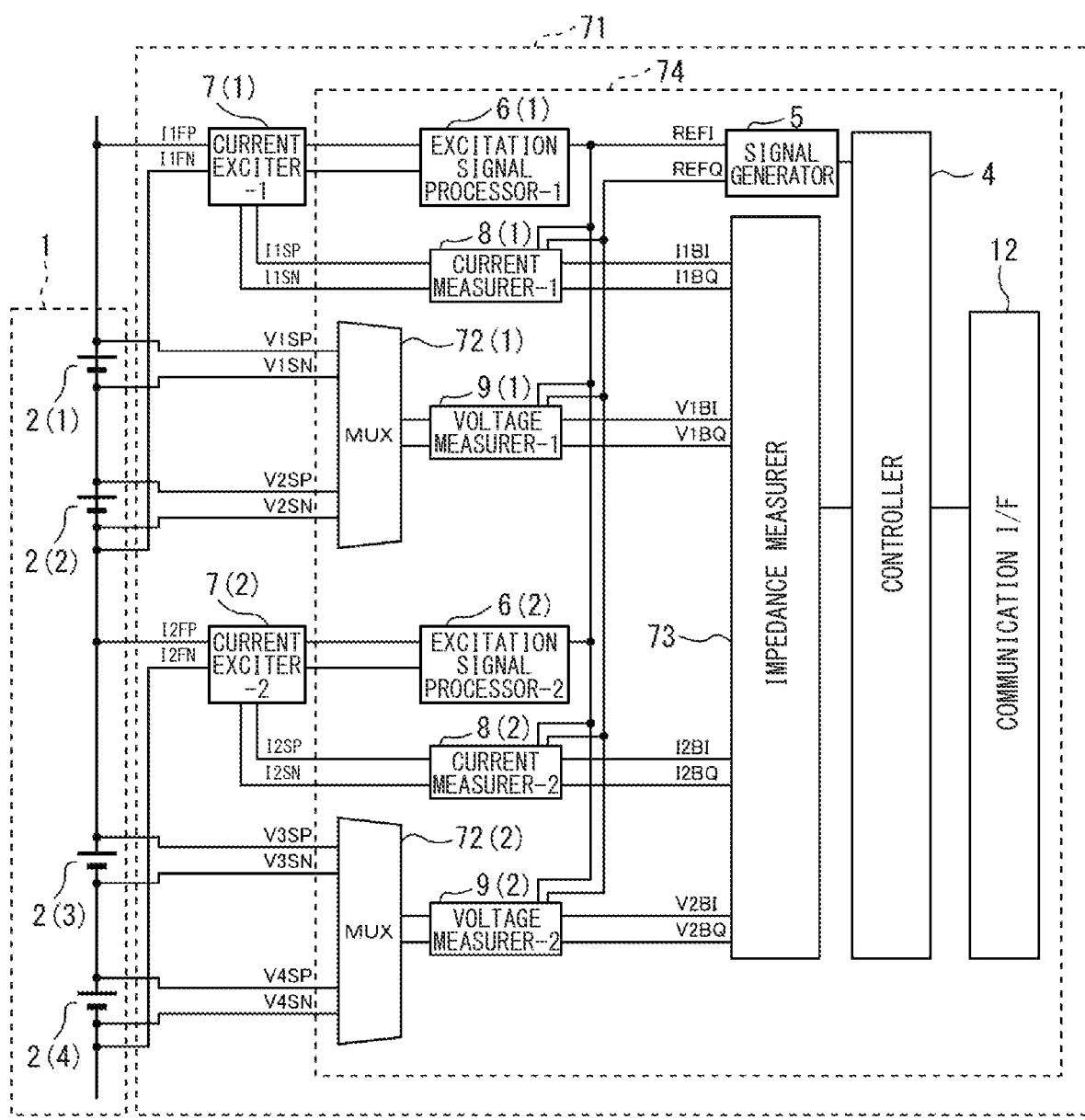
FIG. 17 is a functional block diagram of a configuration of the battery monitoring device according to a fifth embodiment.

As shown in FIG. 17, in a battery monitoring device 71 of the fifth embodiment, the battery cells 2 (1) and 2 (2) are switched by a multiplexer 72 (1), and the battery cells 2 (3) and 2 (4) are switched by a multiplexer 72 (2). Further, the excitation signal processor 6, the current exciter 7, and the current measurer 8 are respectively duplicated. Further, in the battery monitoring device 71, a portion other than the current exciter 7 is configured as an integrated circuit 74.

The excitation signal processor 6 (1) and the current exciter 7 (1) supply the excitation current (1) to the battery cells 2 (1) and 2 (2), and the excitation signal processor 6 (2) and the current exciter 7 (2) supply the excitation current (2) to the battery cells 2 (3) and 2 (4). In such manner, different excitation currents can be simultaneously supplied to each set of battery cells 2, the excitation current (1) is measured by the current measurer 8 (1), and the excitation current (2) is measured by the current measurer 8 (2). Therefore, an impedance measurer 73 can measure the impedance of the two battery cells 2 in parallel while supplying different excitation currents.

Other Embodiments

The number of battery cells 2 is not limited to "4" and may be other number of "2" or more. In the third embodiment, the LPF 53 may be provided as needed. Although the present disclosure has been described in accordance with the examples, it is understood that the disclosure is not limited to such examples or structures. The present disclosure also includes various modification examples and/or modifications within an equivalent range. In addition, various combinations, forms and modes, with an addition/subtraction of one or more elements or less-than one element thereto or therefrom may also be within the sprit and the scope of the present disclosure.

What is claimed is:
1. A battery monitoring system for monitoring a state of a battery having battery cells, the system comprising:
   a reference signal generator that generates two alternating current (AC) orthogonal reference signals which are sine waves and cosine waves having the same frequency;
   an excitation signal generator that generates an excitation signal by processing an in-phase signal which is one of the orthogonal referenced signals;
   a current generator that
      is composed of a series circuit of a resister element, a driving element, and a resister element,
      generates an excitation current by driving the driving element based on the excitation signal and energizes the battery cells, and
      outputs two terminal voltage signals from both ends of the resister element;
   a current measurer that measures the excitation current generated by the current generator;
   a voltage measurer that measures a voltage of a selected battery cell;
   a multiplexer that switches connection between the battery cells and the voltage measurer;
   an impedance measurer that measures an AC impedance of the selected battery cell based on the excitation current measured by the current measurer and the voltage measured by the voltage measurer; and
   a controller that controls measurement of the AC impedance wherein:
   the controller selects the selected battery cell by the multiplexer, and causes the impedance measurer to measure the AC impedance,
   the current measurer includes a first orthogonal demodulator that is composed of two first multipliers,
   the current measurer
      inputs the two terminal voltage signals from the current generator,
      inputs the two reference signals from the reference signal generator, and
      measures the excitation current by performing orthogonal demodulation by causing the two first multipliers to multiply the two terminal voltage signals from the current generator by the two reference signals, respectively, the voltage measurer includes a second orthogonal demodulator that is composed of two second multipliers, and the voltage measurer
- inputs two terminal voltages of the selected battery cell via the multiplexer,
- inputs the two reference signals from the reference signal generator, and
- measures a voltage of the selected battery cell by performing orthogonal demodulation by causing the two second multipliers to multiply the two terminal voltages of the selected battery cell by the two reference signals, respectively.

2. The battery monitoring system of claim 1, wherein the controller switches the multiplexer to a different battery cell after the AC impedance is measured for the selected battery cell.

3. The battery monitoring system of claim 1, wherein the controller switches the multiplexer at each sampling cycle.

4. The battery monitoring system of claim 3 further comprising a rate adjuster that adjusts a voltage sampling rate in the voltage measurer to be equal to a current sampling rate in the current measurer.

5. The battery monitoring system of claim 4, wherein:
the rate adjuster inserts zero into sampled voltage data to increase the sampling voltage rate.

6. The battery monitoring system of claim 5, wherein the voltage measurer includes a low-pass filter that filters a data group in which zero insertion has been performed.

7. The battery monitoring system of claim 1, wherein the battery monitoring system is provided with plural sets of the voltage measurer, the current measurer, and the multiplexer.

* * * * *